(12) United States Patent
Lin et al.

(10) Patent No.: US 7,261,508 B2
(45) Date of Patent: Aug. 28, 2007

(54) METHOD FOR ALIGNING A LOADPORT TO AN OVERHEAD HOIST TRANSPORT SYSTEM

(75) Inventors: Li-Ren Lin, Hsin-Chu (TW); Shi-Ming Wang, Tainan (TW); Cheng-Chang Chang, Tao-Yuan (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 858 days.

(21) Appl. No.: 10/127,111

(22) Filed: Apr. 22, 2002

(65) Prior Publication Data
    US 2003/0198553 A1    Oct. 23, 2003

(51) Int. Cl.
    *H21L 21/677* (2006.01)
(52) U.S. Cl. ..................... 414/217.1; 33/645
(58) Field of Classification Search ............... 414/626, 414/940, 217.1; 33/645
    See application file for complete search history.

(56) References Cited

U.S. PATENT DOCUMENTS

| | | | | |
|---|---|---|---|---|
| 5,655,869 A | * | 8/1997 | Scheler et al. ......... | 414/222.01 |
| 6,065,217 A | * | 5/2000 | Dong ..................... | 33/290 |
| 6,092,678 A | * | 7/2000 | Kawano et al. ........ | 212/86 |
| 6,138,721 A | * | 10/2000 | Bonora et al. ......... | 141/98 |
| 6,163,373 A | * | 12/2000 | Ohtomo et al. ........ | 356/147 |
| 6,256,895 B1 | * | 7/2001 | Akers .................... | 33/286 |
| 6,453,574 B1 | * | 9/2002 | Chen ..................... | 33/645 |

* cited by examiner

*Primary Examiner*—Thomas J. Brahan
(74) *Attorney, Agent, or Firm*—Tung & Associates

(57) ABSTRACT

A method for aligning a loadport of a process machine to an overhead hoist transport (OHT) system which can be carried out by first providing an OHT rail overhanging a cleanroom floor; setting a reference point in the cleanroom in proximity to the OHT rail; marking on the cleanroom floor boundary reference lines for each row of process machines based on the reference point; positioning a process machine on the cleanroom floor with a boundary line of the machine aligned to the boundary reference line; mounting a loadport onto the process machine; and fine tuning a center line of the loadport to a reference line on the floor that is 200 mm apart from and parallel to the boundary reference line.

17 Claims, 4 Drawing Sheets

METHOD FOR ALIGNING A LOADPORT TO AN OVERHEAD HOIST TRANSPORT SYSTEM

FIELD OF THE INVENTION

The present invention generally relates to a method for aligning a loadport of a process machine to an overhead hoist transport (OHT) system and more particularly, relates to a method for aligning a loadport of a process machine to an overhead hoist transport system mechanically by using a reference point, a boundary reference line and a loadport center reference line.

BACKGROUND OF THE INVENTION

In the manufacturing of a semiconductor device, the device is usually processed at many work stations or processing machines. The transporting or conveying of partially finished devices, or work-in-process (WIP) parts, is an important aspect in the total manufacturing process. The conveying of semiconductor wafers is especially important in the manufacturing of integrated circuit chips due to the delicate nature of the chips. Furthermore, in fabricating an IC product, a multiplicity of fabrication steps, i.e., as many as several hundred, is usually required to complete the fabrication process. A semiconductor wafer or IC chips must be transported between various process stations in order to perform various fabrication processes.

For instance, to complete the fabrication of an IC chip, various steps of deposition, cleaning, ion implantation, etching and passivation steps must be carried out before an IC chip is packaged for shipment. Each of these fabrication steps must be performed in a different process machine, i.e. a chemical vapor deposition chamber, an ion implantation chamber, an etcher, etc. A partially processed semiconductor wafer must be conveyed between various work stations many times before the fabrication process is completed. The safe conveying and accurate tracking of such semiconductor wafers or work-in-process parts in a semiconductor fabrication facility is therefore an important aspect of the total fabrication process.

Conventionally, partially finished semiconductor wafers or WIP parts are conveyed in a fabrication plant by automatically guided vehicles or overhead transport vehicles that travel on predetermined routes or tracks. For the conveying of semiconductor wafers, the wafers are normally loaded into cassettes pods, such as SMIF (standard machine interface) or FOUP (front opening unified pod), and then picked up and placed in the automatic conveying vehicles. For identifying and locating the various semiconductor wafers or WIP parts being transported, the cassettes or pods are normally labeled with a tag positioned on the side of the cassette or pod. The tags can be read automatically by a tag reader that is mounted on the guard rails of the conveying vehicle.

In an automatic material handling system (AMHS), stockers are widely used in conjunction with automatically guided or overhead transport vehicles, either on the ground or suspended on tracks, for the storing and transporting of semiconductor wafers in SMIF pods or in wafer cassettes. For instance, three possible configurations for utilizing a stocker may be provided. In the first configuration, a stocker is utilized for storing WIP wafers in SMIF pods and transporting them first to tool A, then to tool B, and finally to tool C for three separate processing steps to be conducted on the wafers. After the processing in tool C is completed, the SMIF pod is returned to the stocker for possible conveying to another stocker. The first configuration is theoretically workable but hardly ever possible in a fabrication environment since the tools or processing equipment cannot always be arranged nearby to accommodate the processing of wafers in the stocker.

In the second configuration, a stocker and a plurality of buffer stations A, B and C are used to accommodate different processes to be conducted in tool A, tool B and tool C. A SMIF pod may be first delivered to buffer station A from the stocker and waits there for processing in tool A. Buffer stations B and C are similarly utilized in connection with tools B and C. The buffer stations A, B and C therefore become holding stations for conducting processes on the wafers. This configuration provides a workable solution to the fabrication process, however, requires excessive floor space because of the additional buffer stations required. The configuration is therefore not feasible for use in a semiconductor fabrication facility.

In the third configuration, a stocker is provided for controlling the storage and conveying of WIP wafers to tools A, B and C. After a SMIF pod is delivered to one of the three tools, the SMIF pod is always returned to the stocker before it is sent to the next processing tool. This is a viable process since only one stocker is required for handling three different processing tools and that no buffer station is needed. This configuration requires a high usage of the stocker since the stocker is used as a buffer station for all three tools. The accessing of the stocker is more frequent than that required in the previous two configurations.

FIG. 1 illustrates a schematic of a typical automatic material handling system 20 that utilizes a central corridor 22, a plurality of bays 24 and a multiplicity of process machines 26. A multiplicity of stockers 30 are utilized for providing input/out to bay 24, or to precessing machines 26 located on the bay 24. The central corridor 22 designed for bay lay-out is frequently used in an efficient automatic material handling system to perform lot transportation between bays. In this configuration, the stockers 30 of the automatic material handling system become the pathway for both input and output of the bay. Unfortunately, the stocker 30 frequently becomes a bottleneck for internal transportation. It has been observed that a major cause for the stockers 30 to be the bottleneck is the input/output ports of the stockers.

In modern semiconductor fabrication facilities, especially for the 200 mm or 300 mm FAB plants, automatic guided vehicles (AGV) and overhead hoist transport (OHT) are extensively used to automate the wafer transport process as much as possible. The AGE and OHT utilize the input/output ports of a stocker to load or unload wafer lots, i.e. normally stored in POUFS. FIG. 2 is a perspective view of an overhead hoist transport system 32 consisting of two vehicles 34, 36 that travel on a track 38. An input port 40 and an output port 42 are provided on the stocker 30. As shown in FIG. 2, the overhead transport vehicle 36 stops at a position for unloading a FOUP 44 into the input port 40. The second overhead transport vehicle 34 waits on track 38 for input from stocker 30 until the first overhead transport vehicle 36 moves out of the way.

Similarly, the OHT system is also used to deliver a cassette pod such as a FOUP to a process machine. This is shown in FIG. 3. A cassette pod 10 of the FOUP type is positioned on a loadport 12 of a process machine 14. The loadport 12 is frequently equipped with a plurality of locating pins 16 for the proper positioning of the cassette pod 10. A detailed perspective view of the FOUP 10 is shown in FIG. 4. The FOUP 10 is constructed of a body portion 18 and a cover portion 28. The body portion 18 is provided with a cavity 46 equipped with a multiplicity of partitions 48 for the positioning of 25 wafers of the 300 mm size. The body portion 18 is further provided with sloped handles 50 on both sides of the body for ease of transporting. On top of the body portion 18, is provided with a plate member 52 for gripping by a transport arm (not shown) of an OHT system (not shown).

When an OHT system is utilized in transporting a cassette pod to a process machine, problems arise when the loadport of the process machine is not in alignment with the OHT system. Mis-positioned cassette pods on a loadport not only affects the operation of loading/unloading wafers from the pod, but also in severely misaligned instances may cause the cassette pod to tip over resulting in the breakage of wafers. Conventionally, a laser surveying instrument is used to align the cassette pod, i.e. the loadport of the process machine, to an OHT system. The laser equipment, even though can be properly used in a pilot plant setup, cannot be used in a fabrication facility for several reasons. First, the laser equipment is costly and difficult to operate. Secondly, laser emission is harmful to human eyes and thus when it is used, disturbs other operators that are working in the same intra-bay. In a production facility, there are frequently 20 or 30 process machines lined up in an intra-bay area. It is therefore extremely difficult to use a laser to align a single machine, while not disturbing the operation of the other machines.

In a modern fabrication facility for processing the 300 mm wafers, the OHT system is the most popularly used cassette transport system. It is therefore very important to be able to align all the loadports of the process machines in a straight line in the same OHT intra-bay to assure the integrity of the fabrication process.

The current practice of alignment of a process machine on the cleanroom floor is by marking the boundary of the equipment on the floor. Problems in alignment occur when each row of the loadports are not parallel to others and furthermore, the width of each bay is not the same or unified. Particularly, loadports are mounted on process machines independently and at different heights when the process machines are different. It is difficult to install several rows of loadports in a straight line precisely when the process equipment is not moved or installed in sequence.

It is therefore an object of the present invention to provide a method for aligning a loadport of a process machine to an OHT system that does not have the drawbacks or shortcomings of the conventional methods.

It is a another object of the present invention to provide a method for aligning a loadport of a process machine to an OHT system mechanically by utilizing a reference point, a boundary reference line and a loadport center reference line.

It is a further object of the present invention to provide a method for aligning a loadport of a process machine to an OHT system by marking two points on the walls and one point on the floor to identify a facial datum plane along the center line of a loadport.

It is another further object of the present invention to provide a method for aligning a loadport of a process machine to an OHT system by marking a boundary reference line and a loadport center reference line on a cleanroom floor.

SUMMARY OF THE INVENTION

In accordance with the present invention, a method for aligning a loadport of a process machine to an overhead hoist transport system mechanically is provided.

In the preferred embodiment, a method for aligning a loadport of a process machine to an overhead hoist transport system can be carried out by the operating steps of providing an OHT rail overhanging a floor in a cleanroom; setting a reference point in the cleanroom in proximity to the OHT rail; marking on the floor boundary reference lines for each row of process machines based on the reference point; and positioning a process machine on the floor with a boundary line of the process machine aligned to the boundary reference line.

The method for aligning a loadport of a process machine to an OHT system may further include the steps of mounting a loadport onto the process machine; and fine tuning a center line of the loadport to a reference line on the floor that is situated 200 mm from the boundary reference line. The method may further include the step of adjusting fine tuning bolts on the process machine to within a 5 mm tolerance during the positioning step, or the step of marking the boundary reference line by a laser, or the step of marking the boundary reference line by a rotary laser. The method may further include the step of marking the boundary reference line for each row of process machine on solid objects, on walls and on ceiling for future retrieval. The method may further include the step of mechanically positioning the process machine on the floor aligned to the boundary reference line. The method may further include the step of adjusting a height of the loadport to 900 mm±3 mm, or the step of fine tuning and aligning the center line of the loadport to the boundary reference line on the floor within an angle of 0°±3°. The method may further include the step of identifying and marking facial datum plane and boundary reference plane by laser beam for each row of process machines.

The present invention is further directed to a method for aligning a loadport of a process machine to an OHT system which can be carried out by the operating steps of providing an OHT rail overhanging a floor in a cleanroom; setting a reference point in the cleanroom in proximity to the OHT rail; marking on the floor a boundary reference line for a row of process machines based on the reference point; marking on the floor a loadport center reference line parallel to and at a distance of 200 mm from the boundary reference line; and aligning a center line of the loadport to the loadport center reference line.

The method for aligning a loadport of a process machine to an overhead hoist transport system may further include the step of aligning the center line of the loadport to the loadport center reference line by mechanically moving the process machine. The method may further include the step of aligning the center line of the loadport to the loadport center reference line by adjusting fine tuning bolts on the process machine, or by adjusting fine tuning bolts on the process machine to within a 5 mm tolerance. The method may further include the step of marking the boundary reference line and the loadport center reference line by a laser, or by a rotary laser.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

The present invention discloses a method for aligning a loadport of a process machine to an overhead hoist transport system.

The method can be carried out by first providing an OHT rail that overhangs a cleanroom floor in a cleanroom, while a reference point, which is the only reference point for the whole cleanroom, is selected and set in proximity to the OHT rail. A boundary reference line is then marked on the floor for each row of process machine based on the reference point. After the process machine is positioned on the floor with a boundary line of the machine aligned to the boundary reference line, and a loadport is mounted onto the process machine, a center line of the loadport is fine tuned to a reference line drawn on the floor that is 200 mm away and parallel to the boundary reference line. A tolerance of 5 mm is normally permitted between the center line of the loadport and the reference line for the loadport center pre-drawn on the floor.

The present invention novel method further identifies a facial datum plane and a boundary reference plane by a laser beam for each row of the process equipment. The facial datum plane is a plane defined by three points, i.e. two points on the partition or on the wall of the cleanroom and one point on the cleanroom floor, which arises from a loadport center reference line marked by a rotary laser on the floor. Similarly, the boundary reference plane is defined by three points, similarly marked, arising from a boundary reference line pre-drawn on the floor by a rotary laser. It is further practiced by the present invention novel method that several lines can be marked on solid objects in the cleanroom, on the cleanroom floor, on the cleanroom walls, or on the cleanroom ceiling, in order to be retrieved at a future time for the installation of additional process equipment. The process equipment can be rough mounted by aligning the boundary line of the equipment to the boundary reference line on the floor, and then, after a loadport is mounted to the equipment, fine tuning a center line of the loadport to a reference center line on the floor which is marked by laser at a distance of 200 mm from the boundary reference line.

Figure 1:
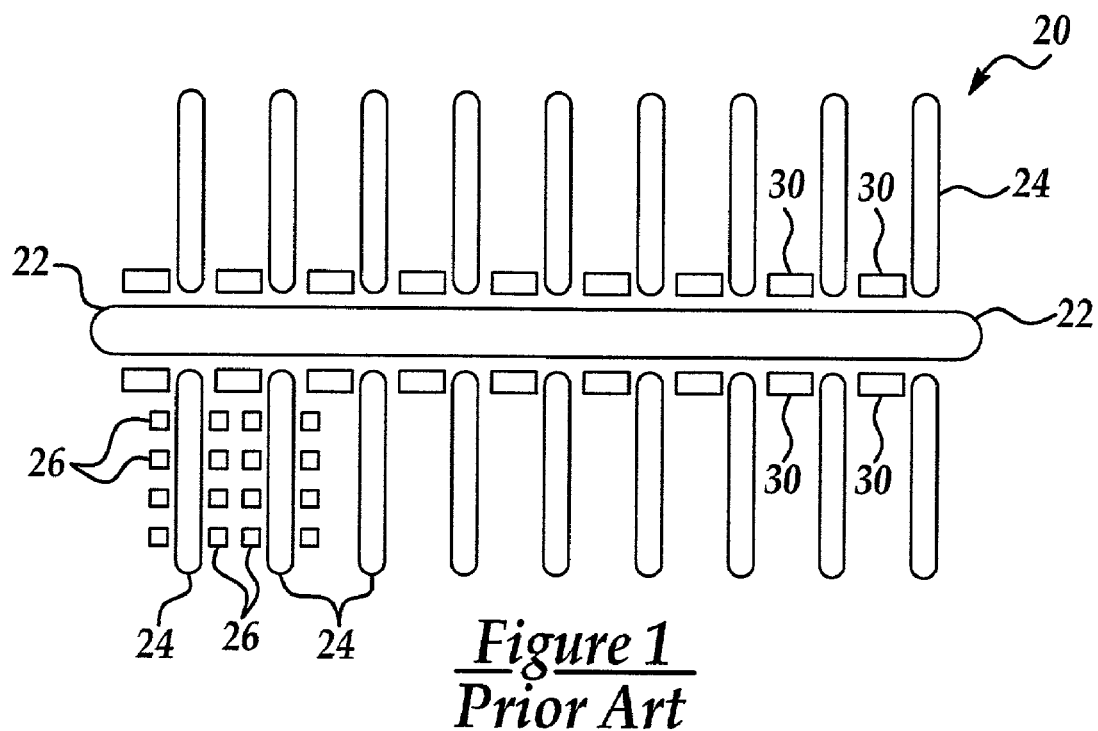
FIG. 1 is a schematic illustrating a conventional automatic material handling system utilizing a central corridor for intra-bay transport.
Figure 2:
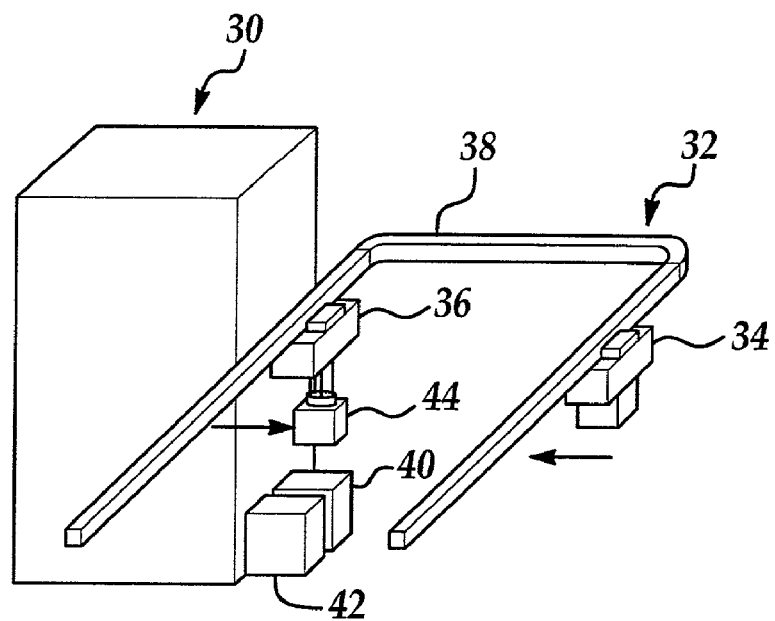
FIG. 2 is a schematic illustrating a conventional overhead hoist transport system for accessing a stocker.
Figure 3:
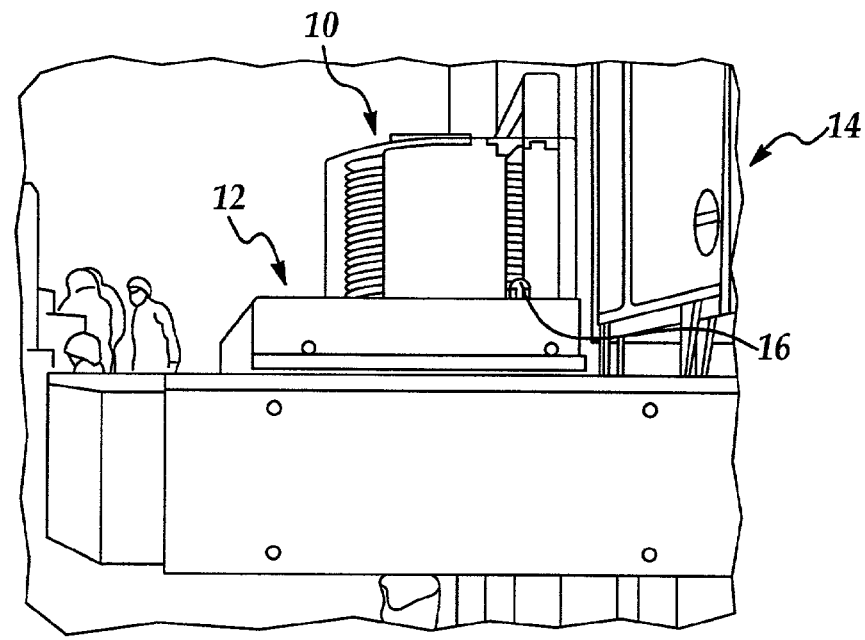
FIG. 3 is a graph illustrating a cassette pod positioned on a loadport of a process machine.
Figure 4:
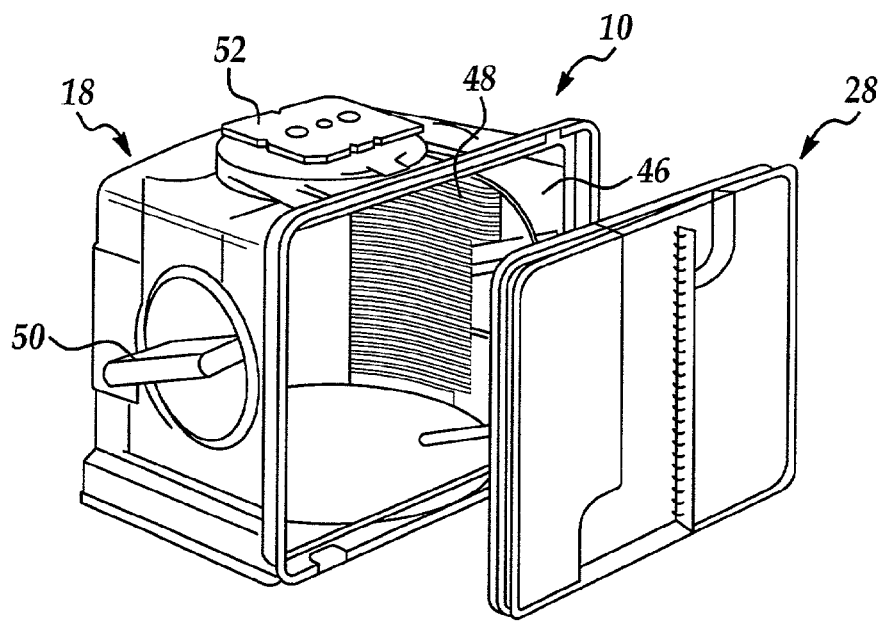
FIG. 4 is a perspective view of a front opening unified pod (FOUP).
Figure 5:
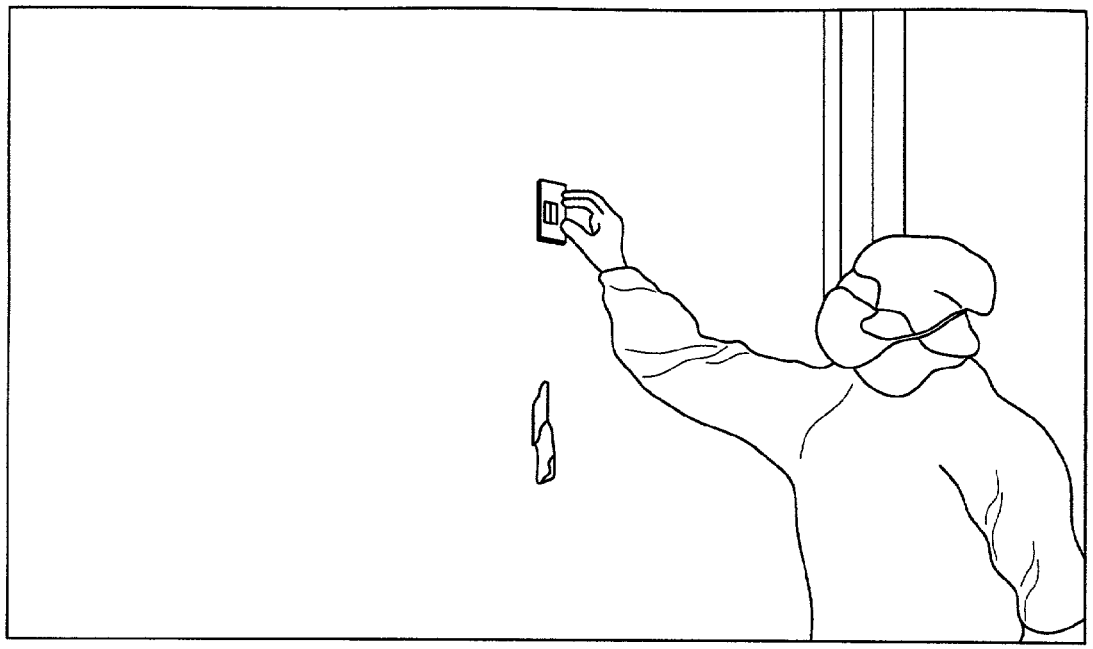
FIG. 5 is an illustration of an operator making marks at least three places on the walls and on the floor for each reference line.

Referring initially to FIG. 5, wherein an illustration of an operator taping tape segments on at least three places on the partitions, on the walls, and on the floor for each reference line, which are based on the reference point previously set for the cleanroom. Based on the single reference point, a facial datum plane and a boundary reference plane can be identified and marked by a laser beam, such as one from a rotary laser for each row of equipment. A plurality of reference lines can be marked on various solid objects in the cleanroom, i.e. on the cleanroom floor, on the cleanroom walls or on the cleanroom ceiling, for future use and to be retrieved at a future time for mounting additional process equipment.

Figure 6:
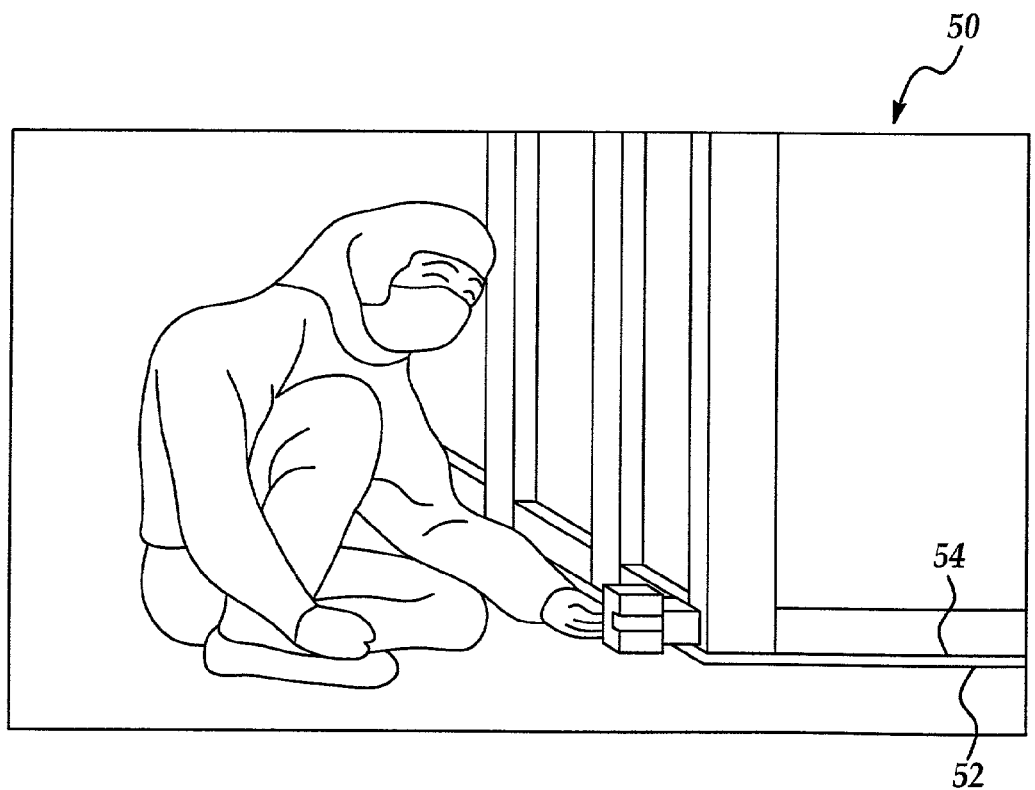
FIG. 6 is an illustration of an operator aligning the boundary line of a process machine to a boundary reference line.

In the next step of the present invention method, as shown in FIG. 6, a process equipment 50 is rough adjusted to the reference boundary line 52 marked on the floor by the boundary line 54 of the equipment 50. The alignment of the equipment boundary line 54 to the reference boundary line 52 can be achieved mechanically either by moving the process equipment 50, or by adjusting fine tuning bolts (not shown) provided on equipment 50. It should be noted that such fine tuning bolts are not always provided on a process equipment and therefore, the physical moving of the equipment may be necessary for the alignment of the boundary line to the reference boundary line.

It was also observed that a process equipment is not normally delivered with its loadport installed. It is therefore difficult to identify the location of the FOUP center line without the loadport. The present invention novel method therefore prealigns a process equipment by its boundary when the equipment (without the loadport) is first delivered to the cleanroom. It was further discovered that for each different manufacturer or model of the process equipment, the distance between the equipment boundary and the FOUP center line may have a different value. While it is difficult to mark the reference boundary lines on the cleanroom floor for every process equipment, the present invention method advantageously selects and marks a boundary reference line on the cleanroom floor that is 200 mm from the FOUP center line.

Figure 7:
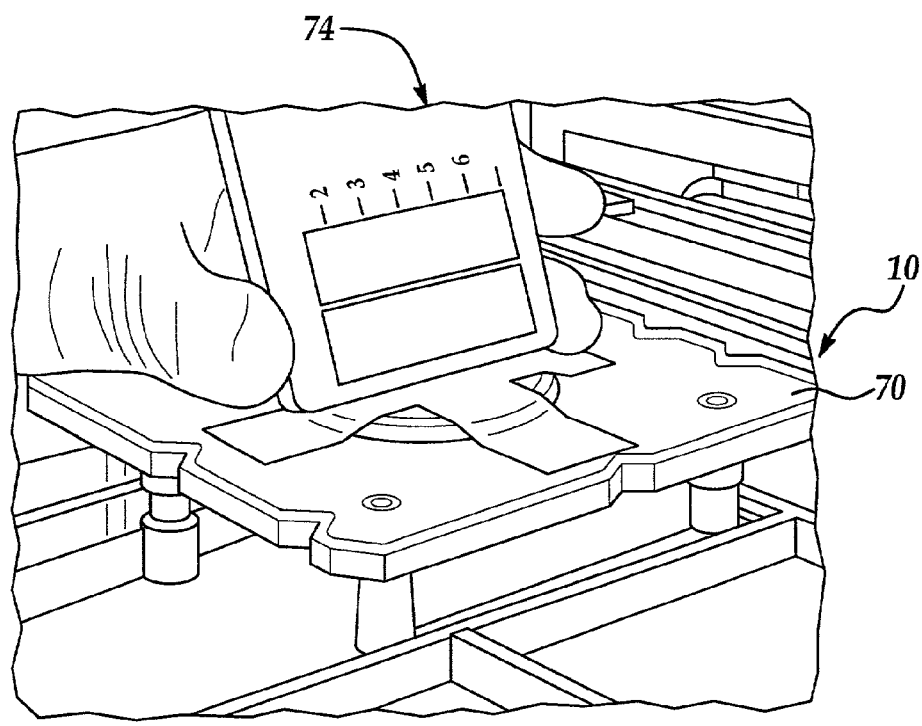
FIG. 7 is an illustration of two perpendicular center lines being formed on top of a cassette pod for alignment.
Figure 8:
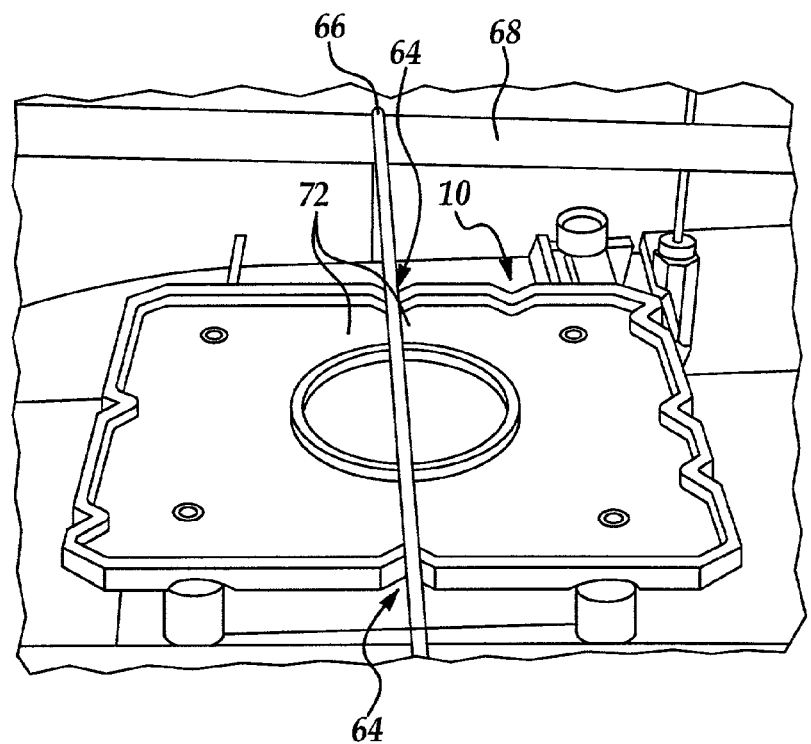
FIG. 8 is an illustration of a center line of a cassette pod being identified by a string and aligned with a loadport center reference line marked on the cleanroom floor.

It is further noted that, as shown in FIGS. 7 and 8, there are two notches identifying the center line of a plate member 72 that is positioned on top of FOUP 10. The center line of FOUP 10 is defined by a line 66 that is stretched over the notches 64. The line 66 may be advantageously stretched over the notches 64 by a pair of oppositely positioned rod 68. This is shown in FIG. 8. The relationship between a loadport center reference line (not shown) marked on the cleanroom floor by a rotary laser and a facial datum plane that arises out of the loadport center line is an accurate indication of the alignment result. It has been noted that it is desirable to load the FOUP during the alignment procedure with an appropriate weight simulating that of a full load of wafers in order to obtain accurate alignment results.

The present invention novel method provides the significant benefit of not requiring the use of a laser alignment system which would disturb the operation of other process machines that are in the intra-bay. The present invention method further provides a method for aligning cassette pods by a simple mechanical method. The method is capable of aligning all the cassette pods, such as FOUPs in a straight line in the same OHT intra-bay without using expensive and difficult-to-operate laser alignment systems. It is particularly suitable for aligning FOUPs or any other cassette pods in a production facility with the other process machines in the same OHT intra-bay in operation.

The method for scribing the reference boundary lines and the loadport center reference lines can be carried out by any suitable method, such as by a rotary laser. The cleanroom floor of the raised floor system is normally fabricated of aluminum and thus is easy to scribe.

Prior to the alignment procedure for the cassette pod, or for the FOUP, two center lines that are perpendicular and intersects each other may be first provided on a top plate member 70 of the cassette pod 10. As shown in FIG. 7, the center lines 72 are first drawn on tapes that are adhesively placed on the top plate member 70 of the FOUP 10. The center lines 72 may be drawn by any suitable equipment, for instance, by a calibration block 74 shown in FIG. 7.

FIG. 8 is a perspective view of the alignment procedure between the loadport reference line laser scribed on the cleanroom floor and the loadport center line by using a string 66. The string 66 overlaps center line defined by the two notches 64. After the loadport is aligned, i.e. by aligning the FOUP 10, the string 66 may be removed and used for aligning the next loadport on the next process machine. The present invention novel method therefore utilizes simple mechanical devices that are easily portable and can be moved around in a production facility for aligning any cassette pod on any process machine.

The present invention novel method for aligning a cassette pod on the loadport of a process machine to an overhead hoist transport system has therefore been amply described in the above description and in the appended drawings of FIGS. 5-8.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows.

What is claimed is:

1. A method for aligning a loadport of a process machine to an overhead hoist transport (OHT) system comprising the steps of:
   providing an OHT rail overhanging a floor in a cleanroom;
   setting a reference point in said cleanroom in proximity to said OHT rail;
   marking on said floor boundary reference lines for each row of process machines based on said reference point;
   positioning a process machine that is not at attached to a loadport on said floor with a boundary line of said process machine aligned to said boundary reference line;
   mounting a loadport onto said process machine; and
   fine tuning a center line of said loadport to reference line on said floor that is situated 200 mm from said boundary reference line.

2. A method for aligning a loadport of a process machine to an overhead hoist transport system according to claim 1 further comprising the step of adjusting fine tuning bolts on said process machine to with a 5 mm tolerance during said positioning step.

3. A method for aligning a loadport of a process machine to an overhead hoist transport system according to claim 1 further comprising the step of marking said boundary reference line by a laser.

4. A method for aligning a loadport of a process machine to an overhead hoist transport system according to claim 1 further comprising the step of marking said boundary reference line by a rotary laser.

5. A method for aligning a loadport of a process machine to an overhead hoist transport system according to claim 1 further comprising the step of marking said boundary reference line for each row of process machines on solid objects, on walls and on ceiling for future retrieval.

6. A method for aligning a loadport of a process machine to an overhead hoist transport system according to claim 1 further comprising the step of manually positioning said process machine on said floor aligned to said boundary reference line.

7. A method for aligning a loadport of a process machine to an overhead hoist transport system according to claim 1 further comprising the step of adjusting a height of said loadport to 900 mm±3 mm.

8. A method for aligning a loadport of a process machine to an overhead hoist transport system according to claim 1 further comprising the step of fine tuning and aligning said center line of the loadport to said boundary reference line on the floor within an angle of 0°±°3.

9. A method for aligning a loadport of a process machine to an overhead hoist transport system according to claim 1 further comprising the step of identifying and marking facial datum plane and boundary reference plane by laser beam for each row of process machines.

10. A method for aligning a loadport of a process machine to an overhead hoist transport (OHT) system comprising the steps of:
    providing an OHT rail overhanging a floor in a cleanroom;
    setting a reference point, in said clean room in proximity to said OHT rail;
    marking on said floor a boundary reference line for a row of process machines based on said reference point;
    marking on said floor a loadport center reference line parallel to and at a distance of 200 mm from said boundary reference line; and
    aligning a center line of said loadport to said loadport center reference line.

11. A method for aligning a loadport of a process machine to an overhead hoist transport system according to claim 10 further comprising the step of aligning said center line of the loadport to said loadport center reference line by manually moving one of said row of process machines.

12. A method for aligning a loadport at a process machine to an overhand hoist transport system according to claim 10 further comprising tho step at aligning said center line of the loadport to said loadport center reference line by adjusting fine tuning bolts on said process machine.

13. A method for aligning loadport of a process machine to an overhead hoist transport system according to claim 10 further comprising the step of aligning said center line of the loadport to said loadport center reference line by adjusting fine tuning bolts on said process machine to within a 5 mm tolerance.

14. A method for aligning a loadport of a process machine to an overhead hoist transport system according to claim 10 further comprising the step of marking said boundary reference line and said loadport center reference line by a laser.

15. A method for aligning a loadport of a process machine to a overhead hoist transport system according to claim 10 further comprising the step of marking said boundary reference line and said transport center reference line by a rotary laser.

16. A method for aligning a loadport of a process machine to a overhead hoist transport system according to claim 10 further comprising the step of adjusting a height of said loadport to 900 mm+3 mm.

17. A method for aligning a loadport of a process machine to an overhead hoist transport system according to claim 10 further comprising the step of fine tuning and aligning said center line of the loadport to said boundary reference line on the floor within an angle of 0°+3°.

* * * * *